United States Patent
Kwack (10) Patent No.: US 7,102,904 B1
(45) Date of Patent: Sep. 5, 2006

(54) SYSTEM AND METHOD FOR MINIMIZING NOISE ON A DYNAMIC NODE

(75) Inventor: Jinho Kwack, Pleasanton, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 26 days.

(21) Appl. No.: 10/934,831

(22) Filed: Sep. 2, 2004

(51) Int. Cl.
*G11C 15/00* (2006.01)
*G06F 12/00* (2006.01)

(52) U.S. Cl. .......................... 365/49; 711/108
(58) Field of Classification Search ................. 365/49; 711/108
See application file for complete search history.

(56) References Cited

U.S. PATENT DOCUMENTS

| | | | |
|---|---|---|---|
| 5,475,825 A * | 12/1995 | Yonezawa et al. | 711/1 |
| 5,764,577 A * | 6/1998 | Johnston et al. | 365/200 |
| 5,936,873 A * | 8/1999 | Kongetira | 365/49 |
| 6,222,752 B1 * | 4/2001 | Kumar et al. | 365/49 |
| 6,373,738 B1 * | 4/2002 | Towler et al. | 365/49 |
| 2005/0201151 A1 * | 9/2005 | Tran et al. | 365/185.03 |
| 2005/0219887 A1 * | 10/2005 | Hsu et al. | 365/49 |

OTHER PUBLICATIONS

David A. Patterson, John L. Hennessy, "The Basic of Caches", *Computer Organization & Design The Hardware/Software Interface*, Second Edition, pages: Cover of Book, Book Information page, p. 557.

\* cited by examiner

*Primary Examiner*—Amir Zarabian
*Assistant Examiner*—Ly Duy Pham
(74) *Attorney, Agent, or Firm*—Martine Penilla & Gencarella, LLP (57) ABSTRACT

A circuit for comparing a first match line and a second match line in a CAM circuit. The circuit includes a first keeper circuit having a first input coupled to the second match line and a second keeper circuit having a second input coupled to the first match line. The circuit also includes a third keeper circuit and a fourth keeper circuit. The first and third keeper circuits are coupled to the first match line so as to be capable of maintaining a first voltage level on the first match line. The second and fourth keeper circuits are coupled to the second match line so as to be capable of maintaining a second voltage level on the second match line.

12 Claims, 10 Drawing Sheets

SYSTEM AND METHOD FOR MINIMIZING NOISE ON A DYNAMIC NODE

BACKGROUND OF THE INVENTION

1. Field of the Invention

The present invention relates generally to systems and methods of comparing two or more dynamic nodes, and more particularly, to systems and methods for minimizing noise on dynamic nodes.

2. Description of the Related Art

A dynamic node is a logic signal line that is connected to one or more, and typically many, dynamic components and circuits. Typically a sensing circuit is connected to a dynamic node to detect the logical level present on the dynamic node. However, due to various dynamic changes occurring in the dynamic components and even in the sensing circuit, a noise signal can be superimposed on the logic level that is present on the dynamic node. Unfortunately, if the noise signal is allowed to become too large, the actual logic level that may be sensed by the sensing circuit can be affected. By way of example, if the noise signal becomes too large, then a logical zero (i.e., a logical low) that is supposed to be on the dynamic node can be sensed as a voltage greater than zero and therefore interpreted as a logical one (i.e., a logical high). Often times, a single sensing circuit compares two dynamic nodes. The noise signal can interfere with the accurate sensing of one or both of the respective logic levels present on the two dynamic nodes.

Many high performance microprocessors include one or more CAM (comparable address memory) cells. The CAM is used, for example, to compare stored data in memory with incoming address data. A CAM cell includes a memory and one or more a comparison device(s). The memory portion includes a SRAM cell and the comparison device includes multiple NMOS devices. The drain of the comparison devices is coupled to the match line. A local match line can be connected to multiple, nearby CAM cells. Typically, many NMOS devices are connected to the local match line. A PMOS, pre-charge device is also typically coupled to the local match line. PMOS, keeper device is also typically coupled to the local match line. The keeper device protects the local match line from being discharged by the NMOS devices in the CAM cells that are attached to the local match line. A sense amplifier is also coupled to the local match line. The sense amplifier senses the status of the local match line. The sense amplifier typically includes a two input NAND gate. However, back-gate coupling from the two input NAND gate can bias the PMOS keeper device. The constant "ON" status of the PMOS keeper device provides a DC current path that can increase the total current flow on the local match line.

Figure 1A:
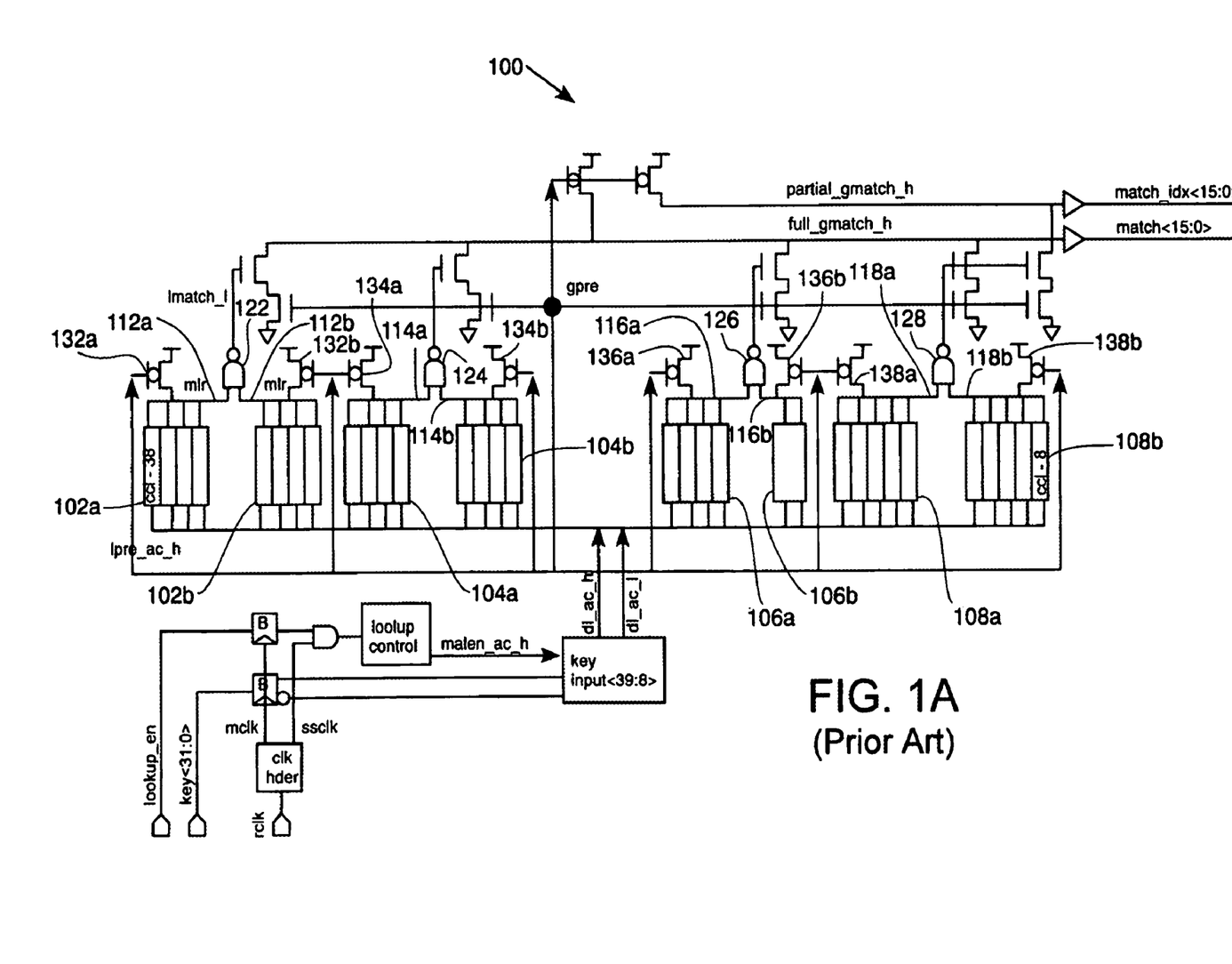
FIG. 1A is a block diagram of a typical hierarchical CAM circuit.

FIG. 1A is a block diagram of a typical hierarchical CAM circuit 100. The hierarchical CAM circuit 100 includes multiple sets of CAM cells 102A, 102B, 104A, 104B, 106A, 106B, 108A and 108B. The sets of CAM cells 102A, 102B, 104A, 104B, 106A, 106B, 108A and 108B each have a respective, local match line 112A, 112B, 114A, 114B, 116A, 116B, 118A and 118B. Each of the local match lines 112A, 112B, 114A, 114B, 116A, 116B, 118A and 118B are a dynamic node that conducts the logic levels being output by the respective set of CAM cells 102A, 102B, 104A, 104B, 106A, 106B, 108A and 108B. By way of example, a first set of CAM cells 102A has a local match line 112A. Similarly, a second set of CAM cells 102B has a local match lines 112B.

A sensing and comparison circuit 122, 124, 126 and 128 are coupled to each respective pair of local match lines 112A, 112B, 114A, 114B, 116A, 116B, 118A and 118B. By way of example, comparison circuit 122 is coupled to local match lines 112A and 112B so as to be able to sense and compare the logic levels on the local match lines. Typically the sensing and comparison circuits 122, 124, 126 and 128 are NAND gates.

Each of the local match lines 112A, 112B, 114A, 114B, 116A, 116B, 118A and 118B are also coupled to respective pre-charge circuits 132A, 132B, 134A, 134B, 136A, 136B, 138A and 138B. The pre-charge circuits 132A, 132B, 134A, 134B, 136A, 136B, 138A and 138B maintain the logic levels on the respective local match lines 112A, 112B, 114A, 114B, 116A, 116B, 118A and 118B so that the respective CAM cells 102A, 102B, 104A, 104B, 106A, 106B, 108A and 108B do not have to sink or source the current required to charge or discharge the local match lines.

Figure 1B:
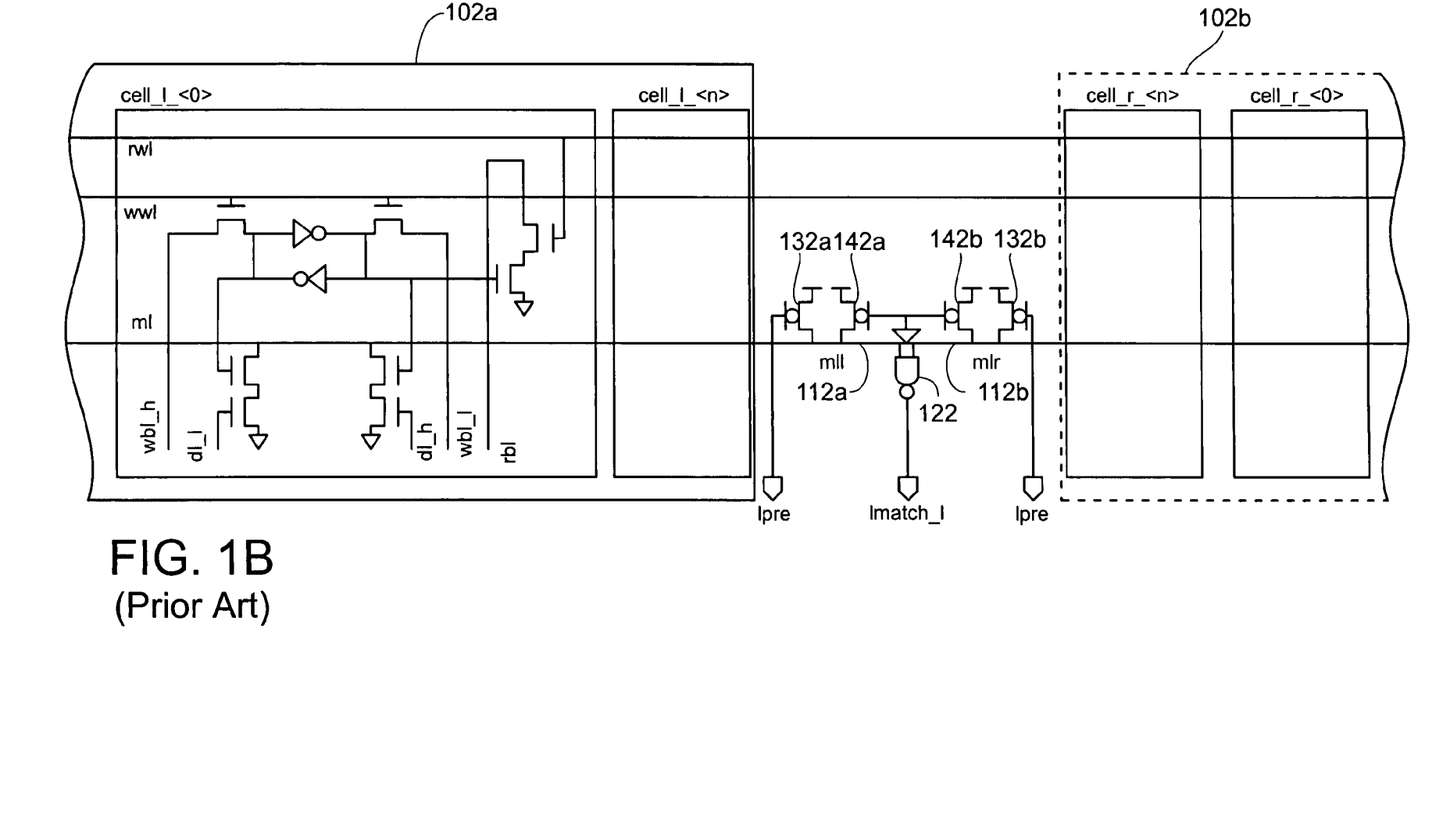
FIG. 1B is a more detailed block diagram the sensing circuit and pre-charge circuits.

FIG. 1B is a more detailed block diagram the sensing circuit 122 and pre-charge circuits 132A and 132B. Each of the local match lines 112A and 112B also has a respective keeper circuit 142A and 142B. The keeper circuits 142A and 142B maintain the logic level of the respective local match lines 112A and 112B at the logic level applied to the local match lines by the respective sets of CAM cells 102A and 102B. Each of the keeper circuits 142A and 142B include a PMOS device with a grounded gate. This configuration of the keeper circuits 142A and 142B is referred to as a grounded gate keeper circuit.

Figure 1C:
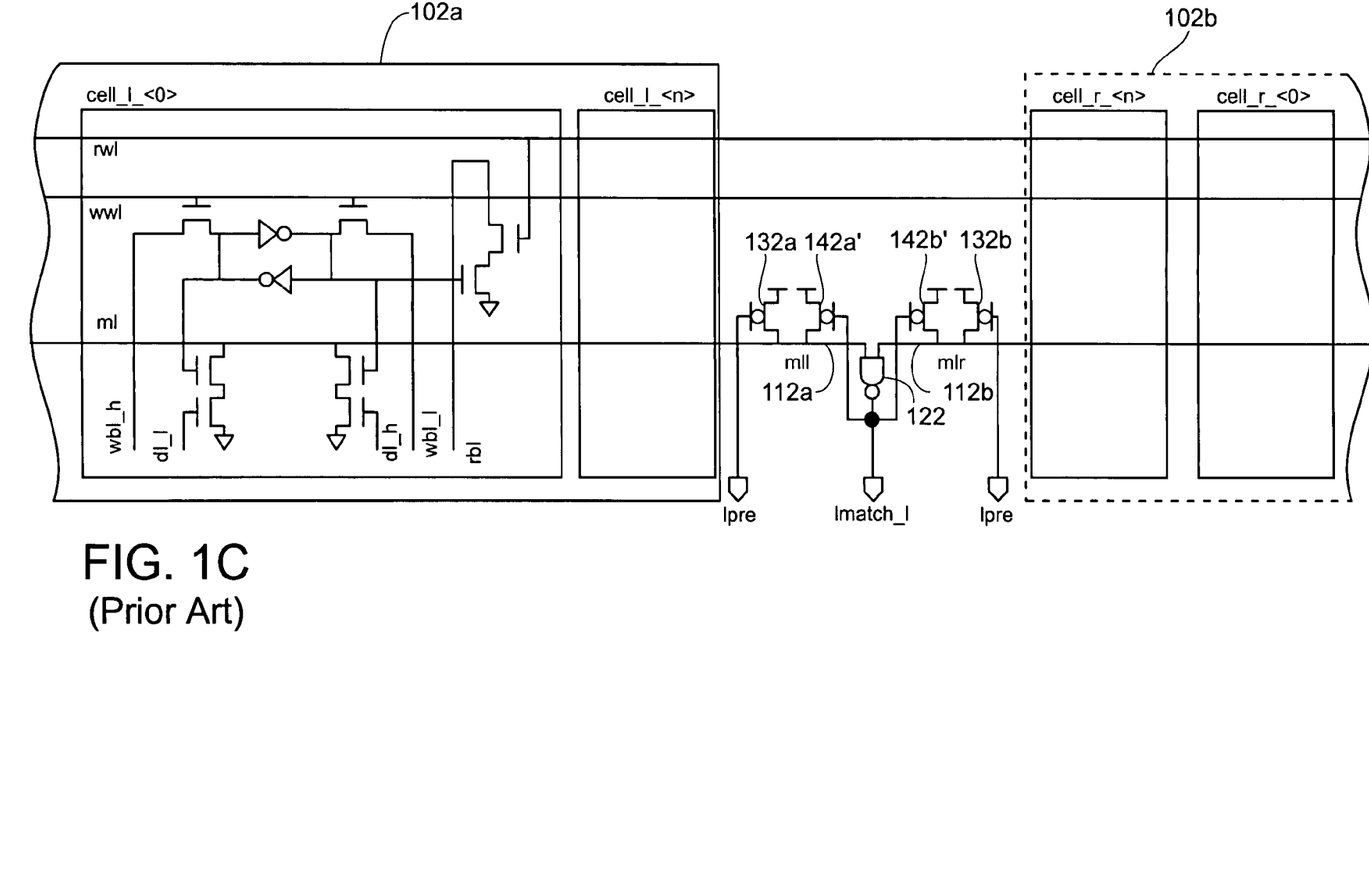
FIG. 1C is another more detailed block diagram the sensing circuit and pre-charge circuits.

FIG. 1C is another more detailed block diagram the sensing circuit 122 and pre-charge circuits 132A and 132B. Each of the local match lines 112A and 112B also has a respective keeper circuit 142A' and 142B'. The keeper circuits 142A' and 142B' maintain the logic level of the respective local match lines 112A and 112B at the logic level applied to the local match lines by the respective sets of CAM cells 102A and 102B. Each of the keeper circuits 142A' and 142B' include a PMOS device with a gate coupled to the output of the sensing circuit 122. This configuration of the keeper circuits 142A' and 142B' is referred to as a feedback gate keeper circuit.

Figure 1D:
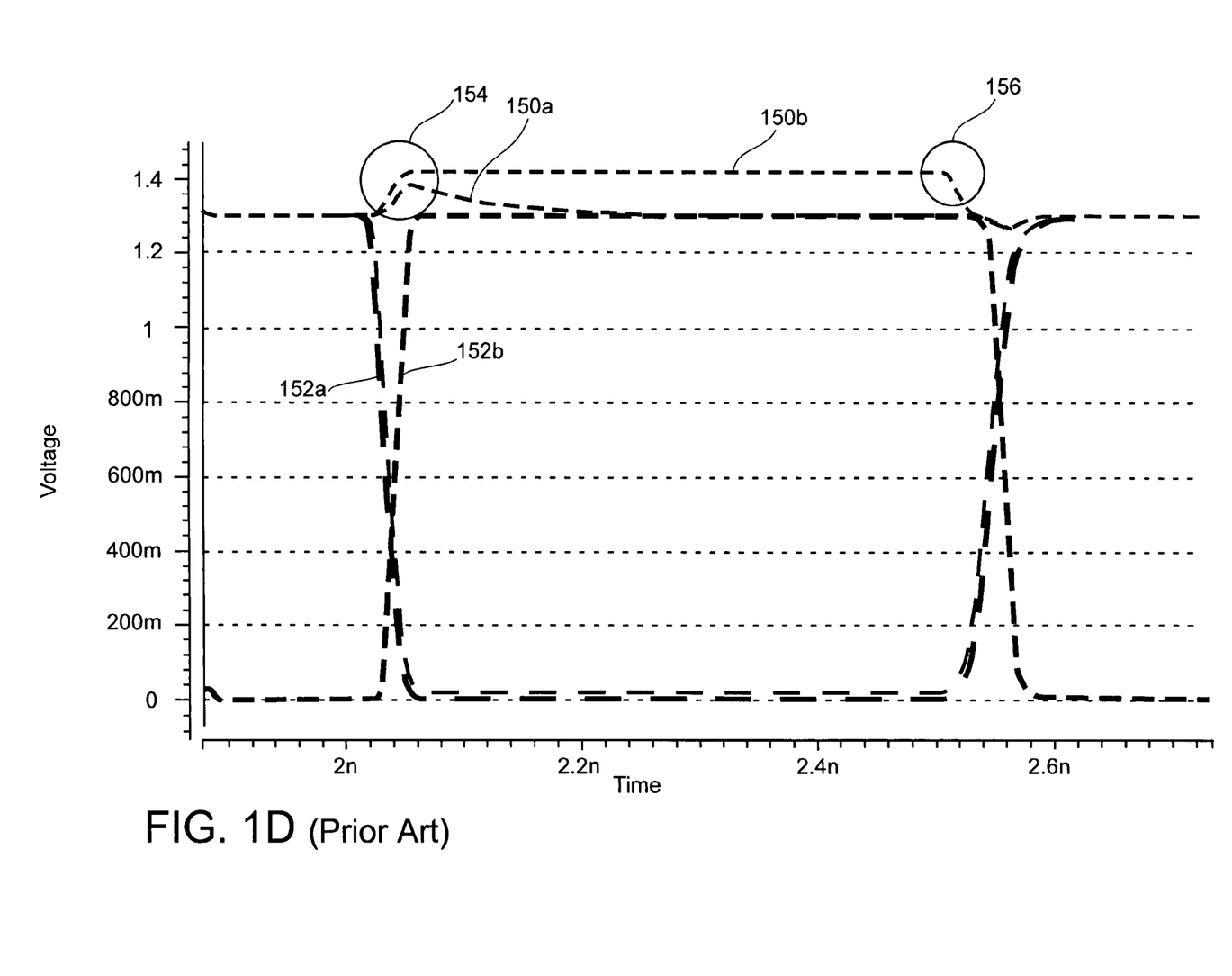
FIG. 1D is a graph of the gate voltage waveforms, respectively, for the grounded gate keeper circuit and the feedback gate keeper circuit.
Figure 1E:
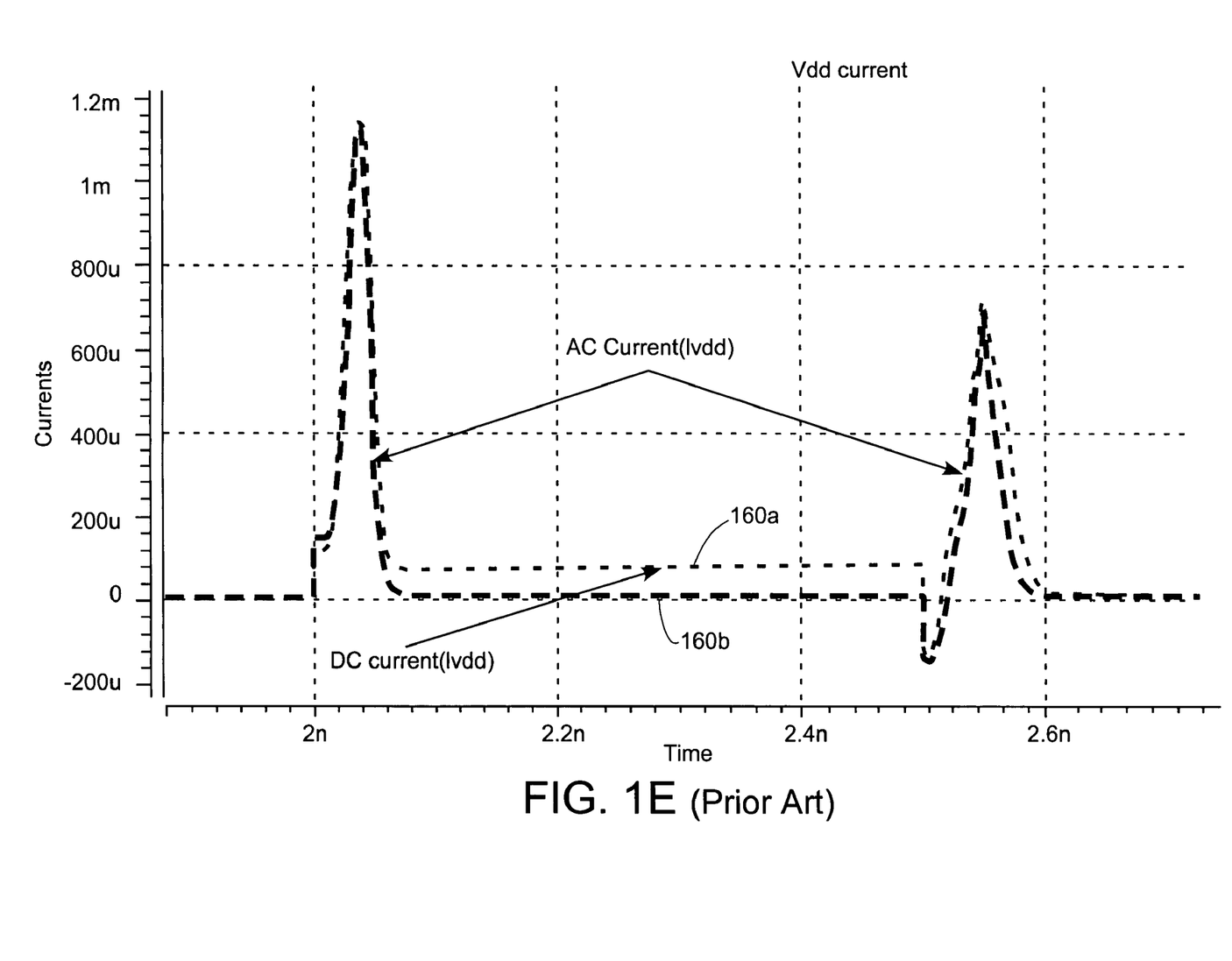
FIG. 1E is a graph of the drain to source current waveforms, respectively, for the grounded gate keeper circuit and the feedback gate keeper circuit.

The different configuration of the gate circuits of the keeper circuits 142A, 142B, 142A' and 142B' yield different performance profiles. FIG. 1D is a graph of the gate voltage waveforms 150A and 150B respectively for the grounded gate keeper circuit and the feedback gate keeper circuit. The voltage on the respective match lines 112A and 112B are represented in graphs 152A and 152B. FIG. 1E is a graph of the drain to source current waveforms 160A and 160B respectively for the grounded gate keeper circuit and the feedback gate keeper circuit. Referring now to FIG. 1D, the gate voltage on the grounded gate keeper circuit incurs a slight increase 154 (e.g., to about 1.45v) coincident with a switching of states on the match line. However, this voltage increase is quickly reduced to the nominal voltage level of the match line (e.g., about 1.25v). In contrast, the gate voltage on the feedback gate keeper circuit also incurs the slight increase 154 but remains at the elevated voltage level (e.g., about 1.45v) until about time 156 when the match line voltage next switches states.

The increased gate voltage on the feedback gate keeper circuit is caused by the backgate coupling from the NAND gate 122. The backgate coupling is undesirable as it increases the leakage current of the feedback gate keeper circuits 142A' and 142B'. As device sizes have become ever smaller, the backgate coupling is increased causing a corresponding increase in leakage current and therefore corresponding increases in overall current consumption and heat dissipation requirements. The backgate coupling can be reduced by increasing the device sizes, however, that consumes very expensive, precious area on the semiconductor die.

Referring now to FIG. 1E, the current waveforms 160A and 160B respectively, for the grounded gate keeper circuit and the feedback gate keeper circuit are shown. The current waveform 160A for the grounded gate keeper circuits 142A and 142B is shown slightly elevated (e.g., at about 80 u amp) as compared to the current waveform 160B for the feedback gate keeper circuits 142A' and 142B' (e.g., at about 0 u amp). The slightly elevated current flow in current waveform 160A is caused by noise on the ground potential. One main source for the noise on the ground potential is again generated by the NAND gate 122.

In view of the foregoing, there is a need for a system and method of maintaining the voltage on the local match lines while substantially reducing the leakage current experienced by the prior art keeper circuits 142A, 142B, 142A' and 142B'.

SUMMARY OF THE INVENTION

Broadly speaking, the present invention fills these needs by providing an improved keeper circuit. It should be appreciated that the present invention can be implemented in numerous ways, including as a process, an apparatus, a system, computer readable media, or a device. Several inventive embodiments of the present invention are described below.

One embodiment provides a circuit for comparing a first match line and a second match line in a CAM circuit. The circuit includes a first keeper circuit having a first input coupled to the second match line and a second keeper circuit having a second input coupled to the first match line. The circuit also includes a third keeper circuit and a fourth keeper circuit. The first and third keeper circuits are coupled to the first match line so as to be capable of maintaining a first voltage level on the first match line. The second and fourth keeper circuits are coupled to the second match line so as to be capable of maintaining a second voltage level on the second match line.

The circuit can also include a first NAND gate having a first NAND input coupled to the first match line and a second NAND input coupled to the second match line.

The first keeper circuit can include a first PMOS device and a second PMOS device coupled in series with the first PMOS device. The first input is coupled to a gate of the second PMOS device and a second NAND gate having a third NAND input coupled to the first match line and a fourth NAND input coupled to an output of the first NAND gate.

The second keeper circuit can include a third PMOS device and a fourth PMOS device coupled in series with the third PMOS device. The second input is coupled to a gate of the fourth PMOS device and a third NAND gate having a fifth NAND input coupled to the second match line and a sixth NAND input coupled to the output of the first NAND gate.

The third keeper circuit can include a fifth PMOS device having a source coupled to the first match line and a gate coupled to the output of the first NAND gate. The fourth keeper circuit can include a sixth PMOS device having a source coupled to the second match line and a gate coupled to the output of the first NAND gate.

The first local match line is coupled to a first plurality of cam cells and the second local match line is coupled to a second plurality of cam cells. The CAM circuit is included in a single die. The single die can include a microprocessor.

The first, second, third and fourth keeper circuits have substantially zero leakage current.

Another embodiment provides a hierarchical CAM circuit. The hierarchical CAM circuit including a first plurality of CAM cells coupled to a first local match line and a second plurality of CAM cells coupled to a second local match line. The hierarchical CAM circuit also includes a comparison circuit. The comparison circuit includes a first keeper circuit having a first input coupled to the second match line and a second keeper circuit having a second input coupled to the first match line. The comparison circuit also includes a third keeper circuit and a fourth keeper circuit. The first and third keeper circuits are coupled to the first match line so as to be capable of maintaining a first voltage level on the first match line. The second and fourth keeper circuits are coupled to the second match line so as to be capable of maintaining a second voltage level on the second match line.

The hierarchical CAM circuit can be included in a microprocessor. The first, second, third and fourth keeper circuits have substantially zero leakage current.

Yet another embodiment provides a circuit for comparing a first match line and a second match line in a CAM circuit. The circuit includes a first keeper circuit having a first input coupled to the second match line and a second keeper circuit having a second input coupled to the first match line. The circuit also includes a third keeper circuit and a fourth keeper circuit. The first and third keeper circuits are coupled to the first match line so as to be capable of maintaining a first voltage level on the first match line. The second and fourth keeper circuits are coupled to the second match line so as to be capable of maintaining a second voltage level on the second match line. The first, second, third and fourth keeper circuits have substantially zero leakage current.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings.

DETAILED DESCRIPTION OF THE EXEMPLARY EMBODIMENTS

Several exemplary embodiments for an improved keeper circuit for use with match line from a CAM cell will now be described. It will be apparent to those skilled in the art that the present invention may be practiced without some or all of the specific details set forth herein.

As described above, the typical CAM cell includes match lines that are coupled to keeper circuits that are affected by the dynamic conditions of the sensing circuit, typically a NAND gate and resulting in undesirable current flow on the match line.

Figure 2A:
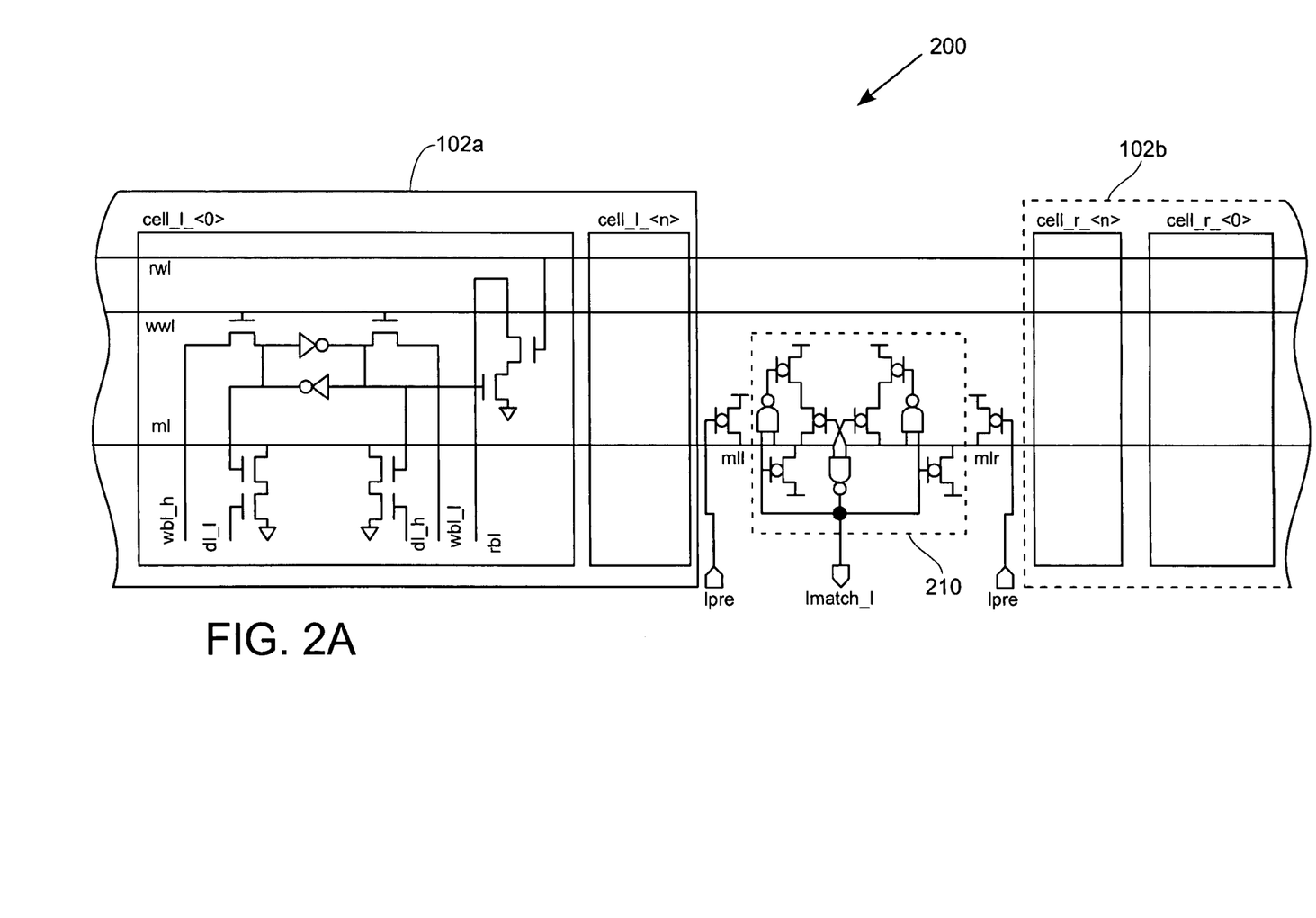
FIG. 2A is a block diagram of an improved CAM cell circuit, in accordance with one embodiment of the present invention.

FIG. 2A is a block diagram of an improved CAM cell circuit 200, in accordance with one embodiment of the present invention. The improved CAM cell circuit 200 includes an improved keeper and sensing circuit 210 for the two sets of CAM cells 102A and 102B.

Figure 2B:
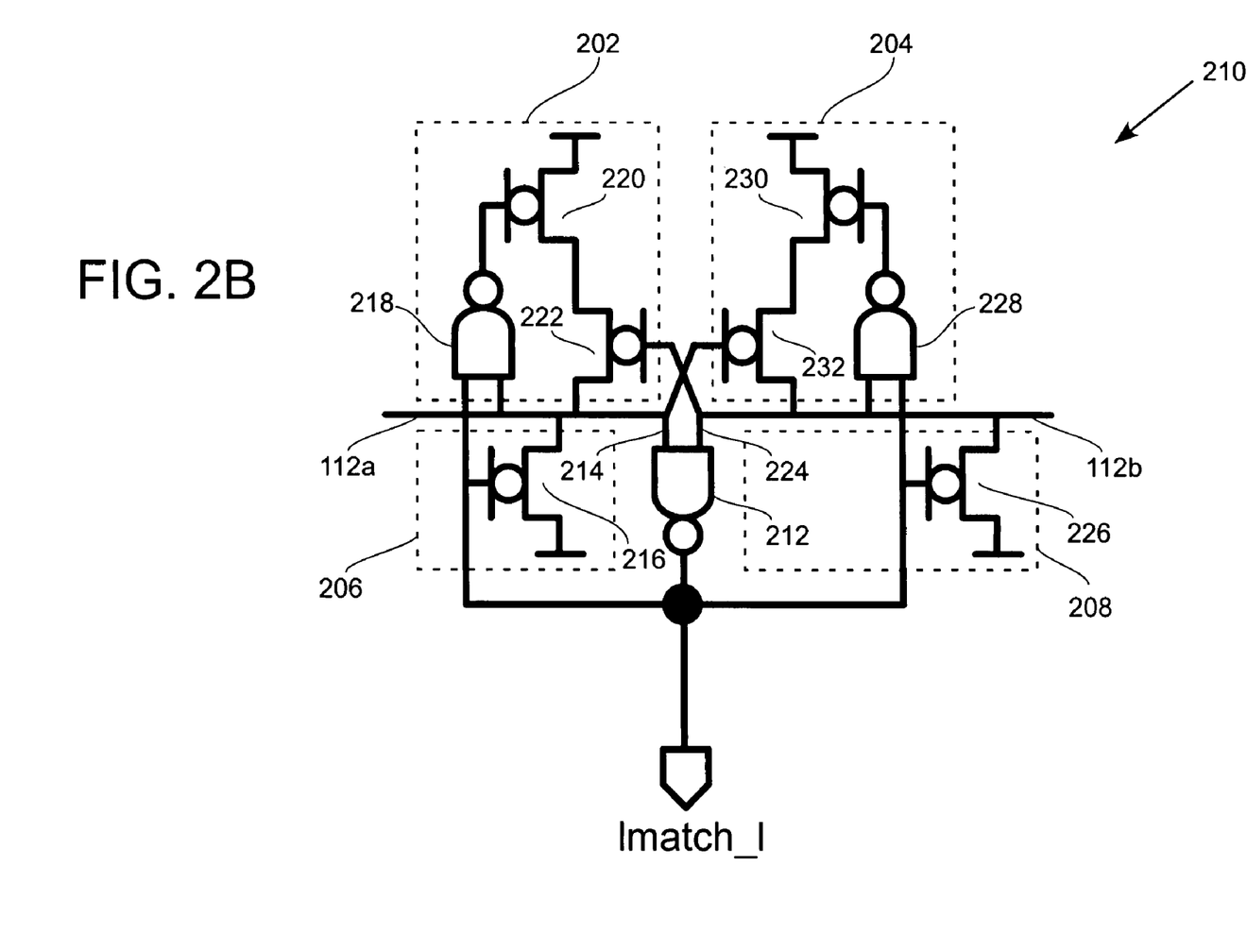
FIG. 2B is a block diagram of the improved keeper and sensing circuit, in accordance with one embodiment of the present invention.

FIG. 2B is a block diagram of the improved keeper and sensing circuit 210, in accordance with one embodiment of the present invention. The improved keeper and sensing circuit 210 includes a two-input NAND gate 212. The NAND gate 212 is substantially similar to the NAND gate 122 as described in FIGS. 1A–1C above. The two inputs 214 and 216 of the NAND gate 212 are coupled to the respective match lines 112A and 112B.

The improved keeper and sensing circuit 210 also includes four improved keeper circuits 202, 206, 204 and 208 coupled to the respective match lines 112A and 112B. The improved keeper circuits 202 and 204 include first PMOS devices 220 and 230 and second PMOS devices 222 and 232. The respective first PMOS devices 220 and 230 and second PMOS devices 222 and 232 are coupled in series to the respective match lines 112A and 112B. The gates of the second PMOS devices 222 and 232 are cross-coupled to the opposite match lines 112B and 112A, respectively. Cross-coupling the improved keeper circuits 202 and 204 to the opposite match lines 112B and 112A, respectively substantially minimizes the undesirable leakage current described in FIGS. 1A–1E above.

The improved keeper circuits 206 and 208 include respective third PMOS devices 216 and 226. The drains of the third PMOS devices 216 and 226 are coupled to the respective match lines 112A and 112B. The gates of the third PMOS devices 216 and 226 are coupled to the output of the NAND gate 212.

The improved keeper circuits 202 and 204 also include secondary, two-input NAND gates 218 and 228. A first input 218A and 228A on each of the secondary, two-input NAND gates 218 and 228 is coupled to the respective match lines 112A and 112B. A second input 218B and 228B on each of the secondary, two-input NAND gates 218 and 228 is coupled to the output of the NAND gate 212. The outputs 218C and 228C of the secondary, two-input NAND gates 218 and 228 are coupled to the gates of the respective first PMOS devices 220 and 230.

Table 1 describes the various operational states of the improved keeper and sensing circuit 210.

TABLE 1

| Match Line 112A | Match Line 112B | NAND Gate 212 Output | Description |
|---|---|---|---|
| 1 | 1 | 0 | Keeper circuits 206 and 208 maintain voltage on the respective match lines 112A and 112B. Keeper circuits 202 and 204 are not conducting (off). |
| 0 | 0 | 1 | Keeper circuits 202, 206, 204 and 208 are off. |
| 0 | 1 | 1 | Keeper circuits 202, 206 and 208 are off. Keeper circuit 204 is conducting to maintain voltage on match line 112B. |
| 1 | 0 | 1 | Keeper circuits 206 and 208 are off. Keeper circuit 202 is conducting to maintain voltage on match line 112A. |

Figure 3A:
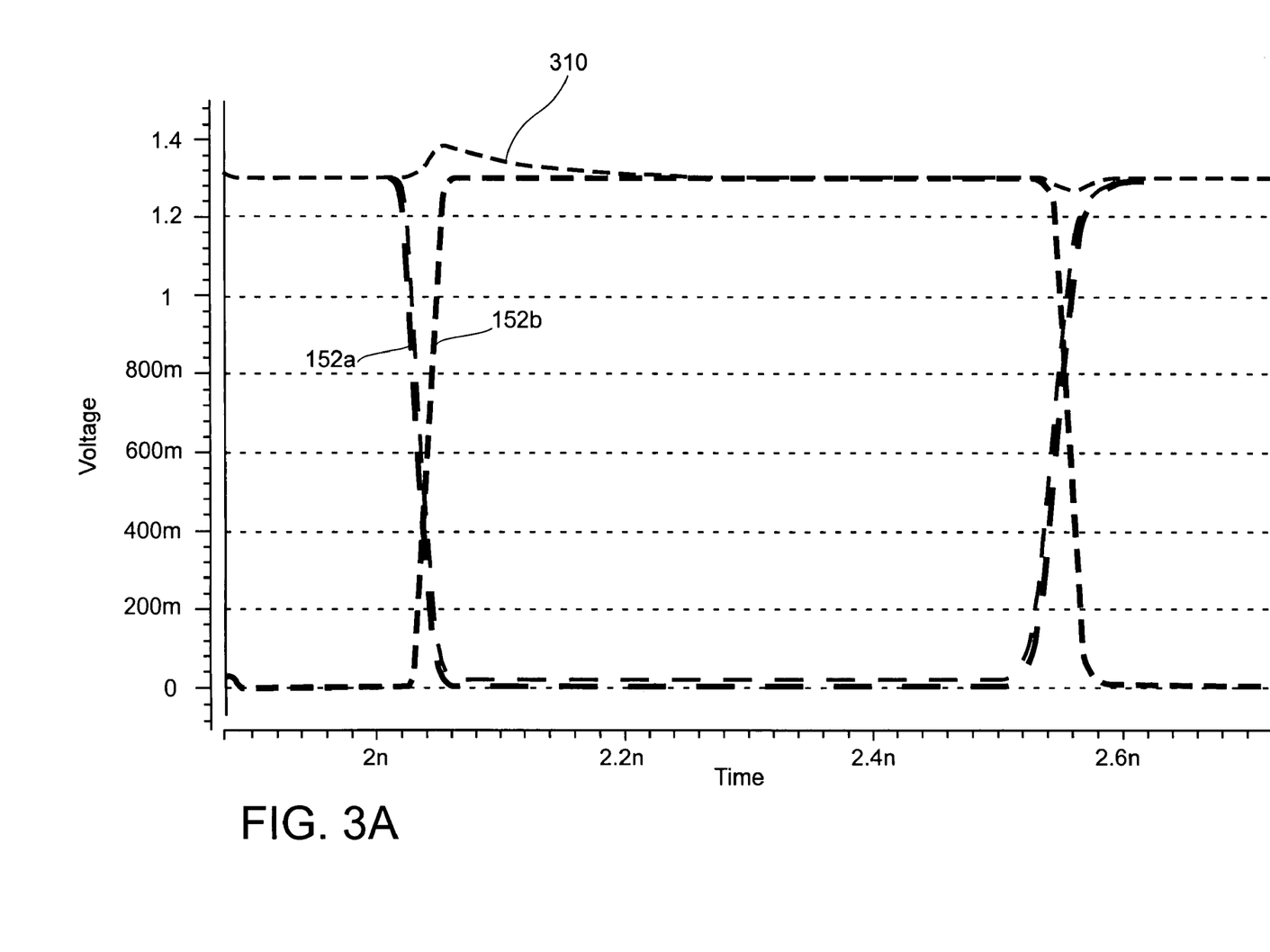
FIG. 3A is a graph of the voltage waveform, respectively, for the improved keeper circuits, in accordance with one embodiment of the present invention.

FIG. 3A is a graph of the voltage waveform 310 respectively for the improved keeper circuits 202, 204, 206 and 208, in accordance with one embodiment of the present invention. As shown in the graph, the voltage only temporarily increases and then settles quickly to the level on the respective match line, well before the match line next switches states.

Figure 3B:
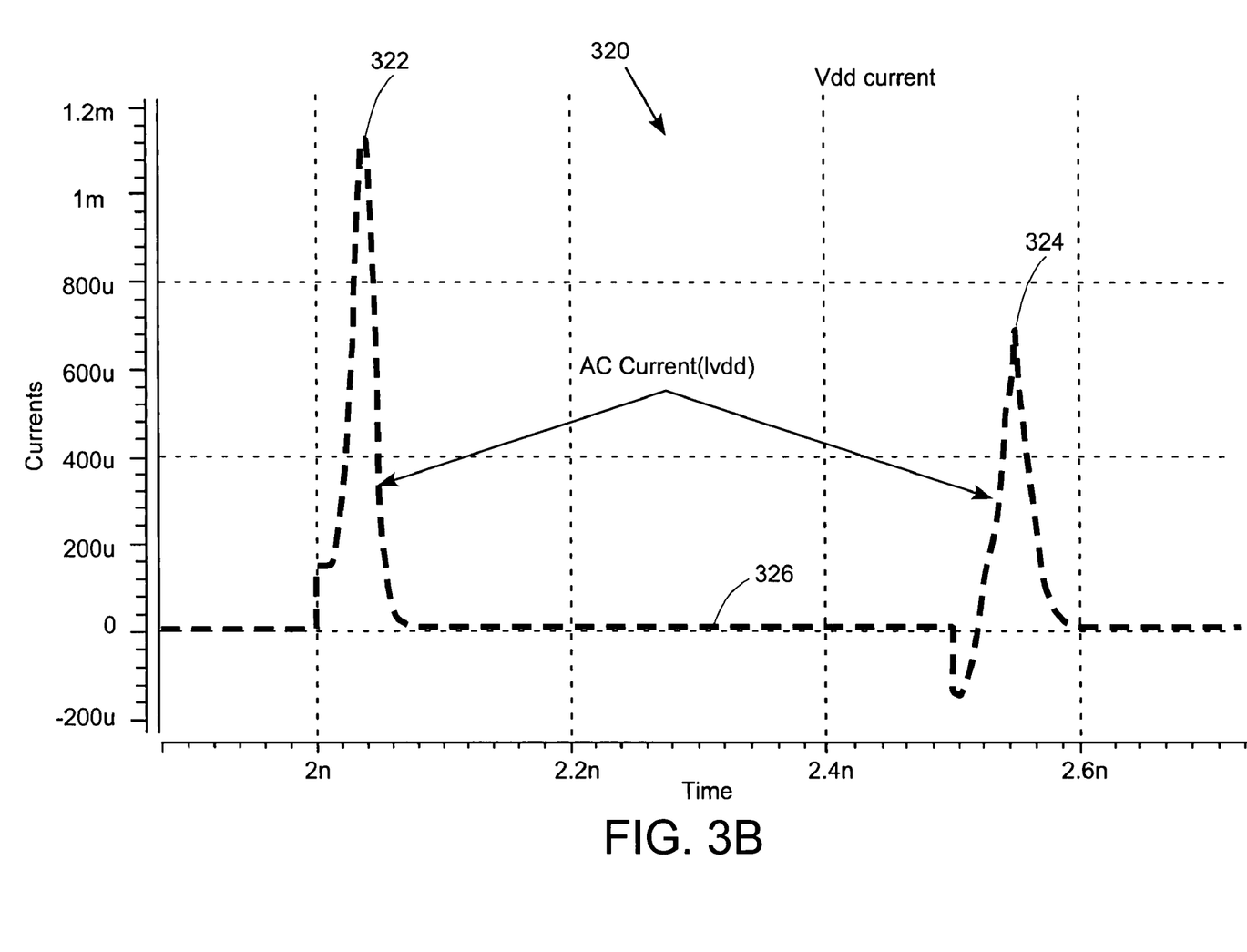
FIG. 3B is a graph of the VDD current, in accordance with one embodiment of the present invention.

FIG. 3B is a graph 320 of the VDD current, in accordance with one embodiment of the present invention. As shown, the VDD current experiences relatively short term spikes 322 that coincide with the match lines switching states. However, during the steady-state period 326 of the match lines, the current flow is substantially equal to zero.

Figure 4:
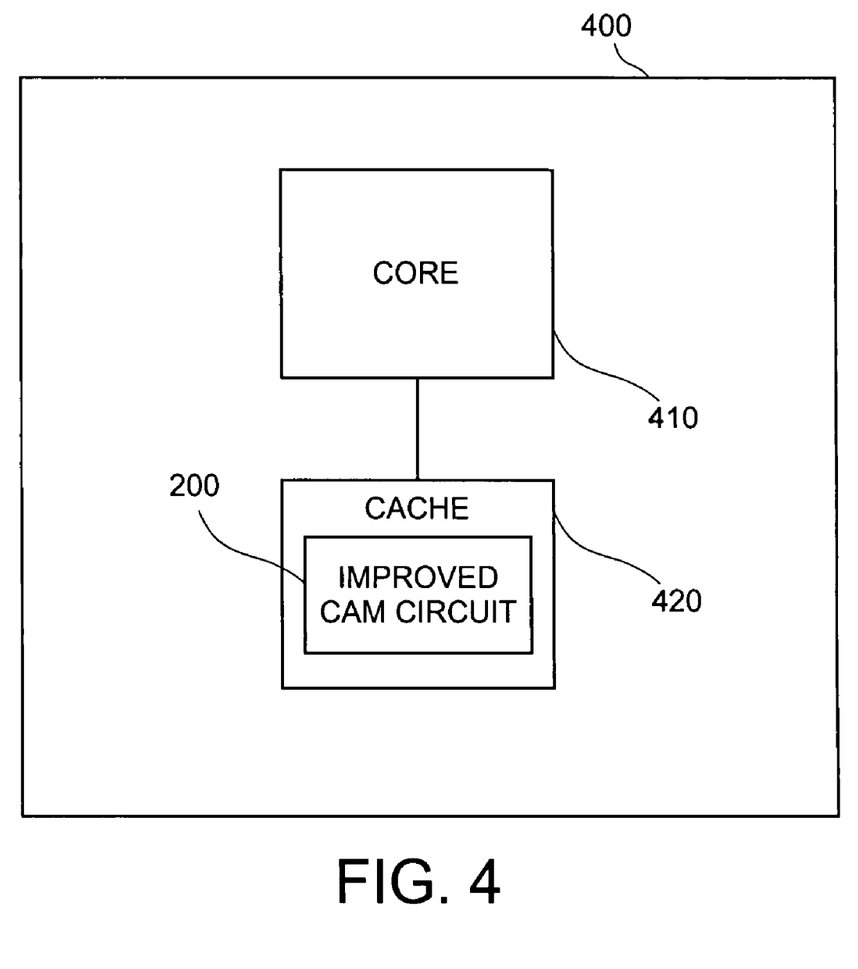
FIG. 4 is block diagram of microprocessor die, in accordance with one embodiment of the present invention.

FIG. 4 is block diagram of microprocessor die 400, in accordance with one embodiment of the present invention. The microprocessor die 400 includes a processing core 410 and a cache memory 420. The cache memory 420 includes an improved with cache and improved cam circuit 200 as described above.

As used herein in connection with the description of the invention, the term "about" means +/−10%. By way of example, the phrase "about 250" indicates a range of between 225 and 275.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general-purpose computer selectively activated or configured by a computer program stored in the computer. In particular, various general-purpose machines may be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data that can thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer systems so that the computer readable code is stored and executed in a distributed fashion.

It will be further appreciated that the instructions represented by the operations in the above figures are not required to be performed in the order illustrated, and that all the processing represented by the operations may not be necessary to practice the invention. Further, the processes described in any of the above figures can also be implemented in software stored in any one of or combinations of the RAM, the ROM, or the hard disk drive.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A circuit for comparing a first match line and a second match line in a CAM circuit comprising:
   a first keeper circuit having a first input coupled to the second match line;
   a second keeper circuit having a second input coupled to the first match line;
   a third keeper circuit;
   a fourth keeper circuit; and
   a first NAND gate having a first NAND input coupled to the first match line and a second NAND input coupled to the second match line,
   wherein the first keeper circuit includes:
      a first PMOS device;
      a second PMOS device coupled in series with the first PMOS device, wherein the first input is coupled to a gate of the second PMOS device; and
      a second NAND gate having a third NAND input coupled to the first match line and a fourth NAND input coupled to an output of the first NAND gate,
   wherein the first and third keeper circuits are coupled to the first match line so as to be capable of maintaining a first voltage level on the first match line, and
   wherein the second and fourth keeper circuits are coupled to the second match line so as to be capable of maintaining a second voltage level on the second match line.

2. The circuit of claim 1, wherein the second keeper circuit includes:
   a third PMOS device;
   a fourth PMOS device coupled in series with the third PMOS device, wherein the second input is coupled to a gate of the fourth PMOS device; and
   a third NAND gate having a fifth NAND input coupled to the second match line and a sixth NAND input coupled to the output of the first NAND gate.

3. The circuit of claim 1, wherein the third keeper circuit includes a fifth PMOS device having a source coupled to the first match line and a gate coupled to the output of the first NAND gate.

4. The circuit of claim 1, wherein the fourth keeper circuit includes a sixth PMOS device having a source coupled to the second match line and a gate coupled to the output of the first NAND gate.

5. The circuit of claim 1, wherein the first local match line is coupled to a first plurality of cam cells and the second local match line is coupled to a second plurality of cam cells.

6. The circuit of claim 1, wherein the CAM circuit is included in a single die.

7. The circuit of claim 6, wherein the single die includes a microprocessor.

8. The circuit of claim 1, wherein the first, second, third and fourth keeper circuits have substantially zero leakage current.

9. A hierarchical CAM circuit comprising:
   a first plurality of CAM cells coupled to a first local match line;
   a second plurality of CAM cells coupled to a second local match line;
   a comparison circuit including:
      a first keeper circuit having a first input coupled to the second match line;
      a second keeper circuit having a second input coupled to the first match line;
      a third keeper circuit;
      a fourth keeper circuit; and
      a first NAND gate having a first NAND input coupled to the fist match line and a second NAND input coupled to the second match line,
      wherein the first keeper circuit includes:
         a first PMOS device;
         a second PMOS device coupled in series with the first PMOS device, wherein the first input is coupled to a gate of the second PMOS device; and
         a second NAND gate having a third NAND input coupled to the first match line and a fourth NAND input coupled to an output of the first NAND gate,
      wherein the first and third keeper circuits are coupled to the first match line so as to be capable of maintaining a first voltage level on the first match line, and
      wherein the second and fourth keeper circuits are coupled to the second match line so as to be capable of maintaining a second voltage level on the second match line.

10. The circuit of claim 9, wherein the hierarchical CAM circuit is included in a microprocessor.

11. The circuit of claim 9, wherein the first, second, third and fourth keeper circuits have substantially zero leakage current.

12. A circuit for comparing a first match line and a second match line in a CAM circuit comprising:
   a first keeper circuit having a first input coupled to the second match line;
   a second keeper circuit having a second input coupled to the first match line;
   a third keeper circuit;
   a fourth keeper circuit; and
   a first NAND gate having a first NAND input coupled to the first match line and a second NAND input coupled to the second match line,
   wherein the first keeper circuit includes:
      a first PMOS device;
      a second PMOS device coupled in series with the first PMOS device, wherein the first input is coupled to a gate of the second PMOS device; and
      a second NAND gate having a third NAND input coupled to the first match line and a fourth NAND input coupled to an output of the first NAND gate,
   wherein the first and third keeper circuits are coupled to the first match line so as to be capable of maintaining a first voltage level on the first match line, wherein the second and fourth keeper circuits are coupled to the second match line so as to be capable of maintaining a second voltage level on the second match line, and wherein the first, second, third, and fourth keeper circuits have substantially zero leakage current.

* * * * *